United States Patent [19]

Namiki et al.

[11] Patent Number: 4,877,712
[45] Date of Patent: Oct. 31, 1989

[54] IMAGE FORMING PROCESS

[75] Inventors: Tomizo Namiki; Kazuo Suzuki; Fumiaki Shinozaki, all of Shizuoka, Japan

[73] Assignee: Fuji Photo Film Co., Ltd., Kanagawa, Japan

[21] Appl. No.: 199,822

[22] Filed: May 27, 1988

[30] Foreign Application Priority Data

May 29, 1987 [JP] Japan ................ 62-134483
Dec. 8, 1987 [JP] Japan ................ 62-311638

[51] Int. Cl.$^4$ ............ G03C 1/90; G03C 11/12
[52] U.S. Cl. ................ 430/256; 430/257; 430/259; 430/262; 430/263
[58] Field of Search ........... 430/256, 257, 258, 259, 430/262, 263, 627

[56] References Cited

U.S. PATENT DOCUMENTS

| | | | |
|---|---|---|---|
| 2,385,599 | 9/1945 | Ball et al. | 430/257 |
| 3,721,557 | 3/1973 | Inoue | 430/257 |
| 4,229,524 | 10/1980 | Yoneyama et al. | 430/536 |
| 4,304,836 | 12/1981 | Cheema et al. | 430/257 |
| 4,482,625 | 11/1984 | Namiki et al. | 430/260 |
| 4,596,757 | 6/1986 | Barton et al. | 430/257 |
| 4,766,053 | 8/1988 | Shinozaki et al. | 430/257 |

FOREIGN PATENT DOCUMENTS 61-189535 8/1986 Japan .

Primary Examiner—Richard L. Schilling
Attorney, Agent, or Firm—Sughrue, Mion, Zinn, Macpeak & Seas

[57] ABSTRACT

An image-forming process comprising the steps of:

(A) transferring an image layer, formed on a transferable light-sensitive material, onto an image-receiving sheet, and (B) transferring the image layer onto a permanent support, wherein the image-receiving sheet comprises a support having formed thereon an image-receiving layer composed of a composition containing an organic high molecular material as the main component, wherein an adhesive power $P_1$ between the support of the image-receiving sheet and the image-receiving layer and an adhesive power $P_2$ between the image-receiving layer and the image layer are higher than an adhesive power $P_3$ between the image layer and the support of the transferable light-sensitive material, and also an adhesive power $P_4$ between the permanent support and the image layer and adhesive power $P_1$ are higher than adhesive power $P_2$, and wherein the image layer is transferred onto the permanent support via the image-receiving sheet without transferring the image-receiving layer onto the permanent support.

9 Claims, No Drawings

IMAGE FORMING PROCESS

FIELD OF THE INVENTION

This invention relates to an image forming process suitable for making color sheets for color proofs, displays, etc.

BACKGROUND OF THE INVENTION

Hitherto, the following processes have been employed for making color sheets for color proofs or displays; (1) a process comprising the steps of: (A) imagewise exposing a light-sensitive laminate composed of a temporary support having formed thereon a peelable layer comprising an organic polymer and a light-sensitive resin layer containing a coloring material, (B) developing to form images on the peelable layer, (C) peeling the peelable layer having the image formed, and (D) transferring the layer onto an optional support (see, e.g., Japanese Patent Publication Nos. 15326/71 (corresponding U.S. Pat. No. 3,721,557), 441/74, etc.), (2) a process comprising the steps of: (A) forming images on a layer on a temporary support, (B) superposing the color image-containing layer on the support on the surface of a sheet, and (C) transferring the image-containing layer on the sheet by pressing under heating (see, e.g., Japanese Patent Application (OPI) Nos. 41830/72, 9337/73, 5101/76, etc.) (the term "OPI" as used herein refers to a "published unexamined Japanese patent application"), (3) a process comprising the steps of: (A) transferring images of each color on a temporary image-receiving sheet having a photopolymerizable image-receiving layer prior to transferring the images on a desired sheet, (B) transferring, the images on the desired sheet, and (C) curing the photopolymerizable image-receiving layer by overall light exposure (see, e.g., Japanese Patent Application (OPI) No. 97410/84 (corresponding to U.S. Pat. No. 4,482,625), (4) a process comprising the steps of: (A) transferring an image-carrying layer formed on a transferable light-sensitive material onto an image-receiving sheet composed of a support having formed thereon a layer of an organic high molecular material, and (B) transferring the images on a permanent support (see, e.g., Japanese Patent Application (OPI) No. 27735/87), and (5) a process comprising the steps of: (A) transferring an image-carrying layer formed on a transferable light-sensitive material onto an image-receiving sheet material composed of a support having formed thereon a 1st layer of a 1st organic high molecular material and a 2nd layer of a 2nd organic high molecular material, and (B) transferring the images onto a permanent support (see, e.g., Japanese Patent Application (OPI) No. 189535/86).

In process (1) above, it is required to use an adhesive each time at which the color images are transferred. Hence, there is a drawback in that in the case of transferring images of each color, it is difficult to match the positions of these images without causing positional discrepancy. Further, process (1) above has inferior workability.

In process (2) above, images can be smoothly and uniformly transferred onto a sheet. However, there is a drawback in that the images obtained are reverse in right and left to the original.

In process (3) above, correct images are obtained to the original and the images can be smoothly and uniformly transferred onto a sheet. However, there are drawbacks in that, since in many cases an unavoidably and slightly colored material (substantially colorless materials, e.g., a polymerization initiator, are preferred) is used in the point of light sensitivity for imparting photopolymerization for the photopolymerizable image-receiving layer, the colors of the color images formed on the desired sheet and the color of the background are discolored as a result of the unavoidably and slightly colored materials in the layer. In addition, since the surface is coated by the photopolymerized image-receiving layer, unnecessary luster appears and hence a matting treatment is required.

In process (4) above, since a light exposure is unnecessary after transferring images onto the image-receiving sheet, there is no problem of discoloring by unaboidably and slightly colored materials. However, there is a drawback in that there is unnecessary luster.

On the other hand, in process (5) above, correct images can be smoothly and uniformly transferred, after transferring onto a transferable image sheet material, onto a desirable sheet, such as a metal plate, a plastic film, a cloth, etc. In addition, there are no troubles of discoloring the transferred images on the sheet and causing unnecessary luster on the surface of the images. Furthermore, in process (5) above, neither a post exposure nor matting process is required upon the transfer of the images as compared with process (3). Moreover, in the case of using paper as the desired sheet, the toughness of the paper increases the resemblance thereof to prints. Additionally, images having high whiteness of the non-image portions can be obtained.

However, since the image-receiving sheet which is used in process (5) above is composed of a support having formed thereon a 1st layer of a 1st organic high molecular material and a 2nd layer of a 2nd organic high molecular material, such a sheet is disadvantageous in terms of its productivity.

Furthermore, in process (5) above, the aforesaid 2nd layer may be transferred together with the image-carrying layer (hereinafter simply referred to as an image layer) on a permanent support upon the transfer of the image layer. In this case, it sometimes happens that images formed on the permanent support swell and have unnecessary luster formed thereon.

Thus, it has been desired to develop an image forming process capable of transferring an initial image layer only onto a permanent sheet as correct images.

SUMMARY OF THE INVENTION

An object of this invention is, therefore, to provide an image forming process capable of only transferring an image layer from an image-receiving layer onto a permanent support using an image-receiving sheet having one image-receiving layer without the need of a post exposure step and a matting step.

The aforesaid object of this invention has been attained by the image-forming process comprising the steps of:

(A) transferring an image layer, formed on a transferable light-sensitive material, onto a image-receiving sheet, and (B) transferring the image layer onto a permanent support, wherein the image-receiving sheet comprises a support having formed thereon an image-receiving layer composed of a composition containing an organic high molecular material as the main component, wherein an adhesive power $P_1$ between the support of the image-receiving sheet and the image-receiving layer and an adhesive power $P_2$ between the image-receiving layer and the image layer are higher than an adhesive power $P_3$ between the image layer and the support of the transferable light-sensitive material, and also an adhesive power $P_4$ between the permanent support and the image layer and adhesive power $P_1$ are higher than adhesive power $P_2$, and wherein the image layer is transferred onto the permanent support via the image-receiving sheet without transferring the image-receiving layer onto the permanent support.

DETAILED DESCRIPTION OF THE INVENTION

The support of the image-receiving sheet in this invention is composed of a flexible material which is chemically and thermally stable. Practically, a thin film of polyethylene terephthalate, polycarbonate, etc., is particularly preferred and as the case may be, a paper laminated with a polyethylene film can be used. The thickness of the support of the image-receiving sheet is preferably 30 to 500 μm, more preferably 50 to 200 μm. Also, for increasing the adhesive power $P_1$ between the support and the image-receiving layer, a surface treatment such as corona discharging treatment, glow discharging treatment, surface matting treatment, ultraviolet irradiation etc., may be applied thereto or an under coating layer may be formed thereon.

It is preferred that the organic high molecular material being used for the image-receiving layer of the image-receiving sheet in the invention is selected from organic high molecular materials having a softening point, as determined by the Vicat method (i.e., a polymer softening point measuring method by ASTMD 1235), of less than about 80° C. This is because by using a polymer having a low softening point, upon transferring the image layer onto a permanent support, such as a paper, etc., by heating under pressure after transferring the image layer on the image-receiving sheet, the image-receiving layer is softened, whereby the image-receiving layer is deformed according to the roughness of both the permanent support, such as paper, etc., and the image layer so as to uniformly and closely adheres the image layer to the permanent support. Thus, the image layer only can be faithfully transferred onto the permanent support without giving any trouble to the images.

When a polymer having a high softening point is used, it is required to transfer the image layer at high temperature, which undesirably gives large injourous effects to the dimensional stability, etc., of the images. Accordingly, the organic high molecular material for use in the invention has a softening point by the Vicat method of lower than, preferably about 60° C., and particularly preferably lower than 50° C.

Specific examples of the organic high molecular material which can be used for the image-receiving layer are polyolefins such a polyethylene, polypropylene, etc.; ethylene copolymers such as an ethylene-vinyl acetate copolymer, an ethylene-acrylic acid copolymer, an ethylene-ethylene acrylate copolymer, an ethylene-α,β-unsaturated carboxylic acid copolymer, etc.; polyvinyl chloride; vinyl chloride copolymers such as a vinyl chloride-vinyl acetate copolymer etc.; polyvinylidene chloride; a vinylidene chloride copolymer; polystyrene; styrene copolymers such as a styrene-(meth)acrylic acid ester copolymer, etc.; vinyltoluene copolymers such as polyvinyltoluene, a vinyltoluene-(meth)acrylic acid ester, etc.; poly(meth)acrylic acid ester; (meth)acrylic acid ester copolymers such as a butyl(meth)acrylic-vinyl acetate copolymer, etc.; polyamide resins such as vinyl acetate copolymer nylon, copolymer nylon, N-alkoxy-methylated nylon, etc.; synthetic rubber; chlorinated rubber, etc. Furthermore, organic high molecular materials having a softening point of lower than about 80° C. desired in Plastic Seino Binran (Performance Handbook) (edited by Nippon Plastic Industrial Association, The Japan Plastic Molding Industrial Association and published October 25, 1968 by Kogyo Chosa Kai) can also be used.

In these organic high molecular materials, a copolymer of ethylene and at least one monomer selected from vinyl acetate, acrylic acid, an alkyl acrylate, and α,β-unsaturated carboxylic acid is particularly suitable. Also, organic high molecular materials having a softening point of higher than about 80° C. can be used if the softening point thereof can be substantially reduced below 80° C. by adding thereto a plasticizer having a compatibility therewith. The typical examples of the plasticizer include phthalic esters, glycol esters, phosphoric esters, dibasic fatty esters, amides, etc. The preferred amount of the plasticizer used is 1 to 40% by weight based on the entire weight of the image-receiving layer, more preferably 5 to 20% by weight.

In addition, the image-receiving layer in this invention can be constructed not only of the aforesaid organic high molecular material but also of various kinds of polymers. The softening points of the polymers added thereto are not always essential. Namely, it is important that the softening point of the image-receiving layer is not higher than 80° C. The polymer having a softening point of not higher than 80° C. and the polymers having a softening point of higher than 80° C. having a compatibility therewith can be used in combination as a component constituting the image-receiving layer if the softening point of the mixture thereof is substantially reduced below 80° C. These polymers admixed and the amounts thereof can be suitably selected by one skilled in the art. Further, supercooling materials, close adhesion improving agents, surface active agents, surface lubricants, etc. can be used in the amounts that do not substantially increase the softening point over 80° C. The typical examples of the supercooling materials include antimony, sodium acetate, acetanilide, benzotriazole, etc. The amount of the supercooling materials used is preferably 0.1 to 40% by weight based on the entire weight of the image-receiving layer, more preferably 2 to 20% by weight. The typical examples of the close adhesion improving agents include vinylsilane, acrylsilane, epoxysilane, aminosilane, etc. The amount of the close adhesion improving agents is preferably 0.01 to 20% by weight based on the entire weight of the image-receiving layer, more preferably 0.1 to 5% by weight. The typical examples of the surface active agents include a nonionic surface active agent such as sorbitan fatty esters, glycerin fatty esters, polyethylene glycol fatty esters, etc.; an anionic surface active agent such as alkyl sulfates, polyoxyethylene alkyl ether sulfates, etc.; a cationic surface active agent such as alkyl ammonium salts, alkylbenzyl ammonium salts, etc.; an ampholytic surface active agent such as betaine acetate, imidazolinium betaine, etc., more preferably a fluorine series surface active agent such as perfluoroalkylcarboxylic acid salts, perfluoroalkylethylene oxide adducts, an oligomer containing a perfluoroalkyl group, a hydrophilic group an a lipophilic group, etc. The preferred amount of the surface active agent is 0.1 to 40% by weight based on the entire weight of the image-receiving layer, more preferably 2 to 10% by weight. The typical examples of the surface lubricants include silicone oil, fluorine series resins, silicon series resins, etc. The preferred amount of the surface lubricants is 0.1 to 40% by weight based on the entire weight of the image-receiving layer, more preferably 2 to 20% by weight.

The image-receiving layer in this invention is required to have an adhesive power for transferring the image layer onto the image-receiving sheet (hereinafter, this adhesive power is referred to as $P_2$). $P_2$ must be balanced so that upon transferring the image layer to the permanent support, the image-receiving layer itself is not transferred and the image layer only is transferred onto the permanent support. For the purpose, it is preferred to use, in particular, as the image-receiving layer a fluorine-series surface active agent which is a copolymer composed of an acrylate or methacrylate component containing from 10 to 70% by weight of a fluoroaliphatic group, and 90 to 30% by weight of a poly(oxyalkylene) acrylate or methacrylate, said fluoroaliphatic group being a fluoroaliphatic group having from 3 to 20 carbon atoms, at least 3 carbon atoms of the terminal moiety being fluorinated, and containing at least 40% by weight of fluorine.

Practical examples of the fluorine-series surface active agent are as follows:

(1) a copolymer (molecular weight of 20,000) of

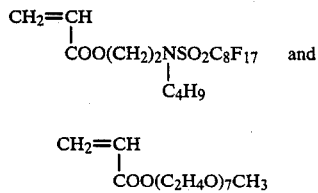

at 40:60 by weight ratio, (2) a copolymer (molecular weight of 5,000) of

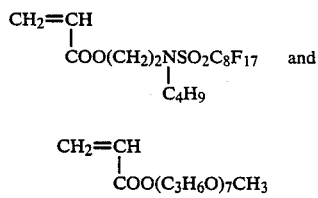

at 60:40 by weight ratio, and (3) a copolymer (molecular weight of 50,000) of

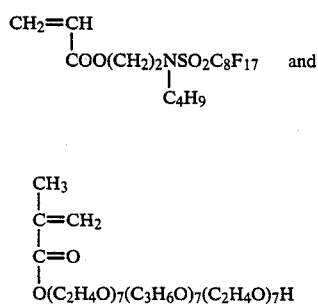

at 30:70 by weight ratio.

The addition amount of the surface active agent is preferably from 2 to 40% by weight, and particularly preferably from 2 to 10% by weight of the entire weight of the image-receiving layer. If the amount of the surface active agent is less than 2% by weight, the adhesive power of the image-receiving layer is strong. Thus, upon transferring the image layer onto a final support (permanent support) such as paper, etc., after transferring the image layer to the image-receiving sheet, if there are direct contact portions of the image-receiving layer and the final support, an inconvenience of picking occurs as described in Japanese Patent Application (OPI) No. 189535/86 (corresponding to U.S. patent application Ser. No. 830,816, now U.S. Pat. No. 4,766,053, filed on February 19, 1986). On the other hand, if the addition amount of the surface active agent is increased, there is a tendency of increasing the sticking of the image-receiving layer, oozing out of the surface active agent, etc. If the addition amount is over 40% by weight, the tendency is undesirably increased.

Also, the thickness of the image-receiving layer is from 1 to 50 $\mu$m, and preferably from 5 to $+\mu$m.

One of the reasons for selecting the thickness of the image-receiving layer as described above is that in the case of transferring the images transferred to the image-receiving sheet onto a permanent support, it is necessary that the thickness of the image-receiving layer is thicker than the unevenness of the surface of the permanent support. Another reason is that when the image layer is transferred to the image-receiving sheet, an unevenness forms between the image portions and the non-image portions. Thus, although the thickness of the image-receiving layer may be thin in the case of single color, when four or more colors are superposed as in the case of color proof, it is preferred that the thickness of the image-receiving layer is four times the unevenness between the image portions and the non-image portions of each color. That is, the thickness of the image layer and the thickness of the image-receiving layer is selected in the above-defined range since the thickness of the image layer formed on an ordinary transferable light-sensitive material is usually in the range of from 1 to 8 $\mu$m, preferably from 1 to 5 $\mu$m.

The image layer in this invention is formed on the temporary support for a light-sensitive material. The light-sensitive material is basically composed of a temporary support and a light-sensitive resin layer containing a coloring material formed thereon. By imagewise exposing the light-sensitive material and then developing it with a developer to remove either one of the exposed portions and the non-developed portions (etching), images colored by the aforesaid coloring material are formed. The images thus formed on the temporary support are hereinafter called the "transferable image layer", and the light-sensitive material having such a light-sensitive resin layer on a temporary support is hereinafter called the "transferable light-sensitive material".

The light-sensitive material which is used for the process of this invention has a peelable layer between the temporary support and the light-sensitive resin layer containing a coloring material. A proper peeling property and a proper adhesive property are imparted to the peelable layer to give it an adhesive function and a peeling function, whereby the latitude for the image transferring temperature can be widened and also the selection width for the image transfer materials can be widened. In this case, the peelable layer may be removed together with the portions of the light-sensitive resin layer removed during the aforesaid development process or etching or may remain as film without being removed upon etching. The paper peeling property can be imparted to the peelable layer by suitably selecting an organic high molecular material as a constituent of the peelable layer. That is, an organic high molecular material capable of peeling from a temporary support which does not have adhesion properties at a room temperature but exhibits adhesion and fusing properties upon heating can be preferably used. The typical examples of these organic high molecular materials to be applied on the temporary support include polyacrylic acid esters, acrylic acid ester copolymers, polymethacrylic acid ester, methacrylic ester copolymers, polyacrylamide, acrylamide copolymers, polyvinyl acetate, vinyl acetate copolymers, polyvinyl chloride, vinyl chloride copolymers, polyvinylidene chloride, vinylidene chloride copolymers, polystyrene, styrene copolymers, ethylene copolymers (e.g., an ethylene-vinyl acetate copolymer, an ethylene-acrylic acid ester copolymer, an ethylene-vinyl chloride copolymer, an ethylene-acrylic acid copolymer, etc.), polyvinyl acetals (e.g., polyvinyl butyral, polyvinyl formal, etc.), polyester resins, polyamide resins (e.g., nylon, copolymer nylon etc.), various rubbers (e.g., synthetic rubber, chlorinated rubber, etc.), polyolefins (e.g., polyethylene, polypropylene, etc.), and the like as described in Japanese Patent Application (OPI) No. 2040/88. The thickness of these organic high molecular materials applied on the temporary support is preferably 0.1 to 5 $\mu$m, more preferably 0.3 to 1.0 $\mu$m. As a temporary support, a chemically and thermally stable support having a flexibility can be preferably used. If desired, the temporary support may have chemical light ray transmission properties. The typical examples of the temporary support include polyolefins such as polyethylene, polypropylene, etc.; polyvinyl halides such as polyvinyl chloride, polyvinylidene chloride, etc.; cellulose derivatives such as cellulose acetate, nitrocellulose, cellophane, etc.; polyamides; polystyrenes; polycarbonates; polyimides, etc. Among these supports, a biaxially oriented polyethylene terephthalate film having excellent dimentional resistance and transparency is particularly preferred. The thickness of the temporary support is preferably 30 to 500 $\mu$m, more preferably 50 to 200 $\mu$m. Furthere, the preferred thickness of the light-sensitive resin layer is 0.5 to 10 $\mu$m, more preferably 1 to 5 $\mu$m.

When the light-sensitive material for use in this invention is composed of a temporary support, a peelable layer formed thereon, and a light-sensitive resin layer containing a coloring material formed on the peelable layer, the transferable image layer is composed of the image light-sensitive resin layer formed by imagewise exposure and development and the peelable layer.

Upon transferring the image layer onto the image-receiving sheet, when the imaged portions of the light-sensitive resin layer remain after development and the peelable layer is not removed by etching (development), the image layer is transferred by adhering of the non-image portions of the peelable layer to the image-receiving layer transferred to the image-receiving sheet. When the image layer transferred to the image-receiving sheet is transferred onto a permanent support, the image layer is transferred by adhering of the peelable layer to the permanent support. The typical examples of the permanent support include papers such as a coated paper to be usually used for a printing, a rough paper, etc.; a metal plate such as aluminum-plate, tin-plate, etc.; a cloth; plastic film such as polyethylene film, etc. These supports can be suitably selected for the purposes of the present invention.

Accordingly, when the peelable layer is not removed by etching at development of the light-sensitive resin layer, the adhesive power $P_2$ between the image-receiving layer and the image layer is the adhesive power between the image-receiving layer and the imaged light-sensitive resin layer after development and also the peelable layer at the non-image portions. In addition, the adhesive power $P_3$ between the transferable image layer and the temporary support is the adhesive power between the peelable layer and the temporary support. Furthermore, the adhesive power $P_4$ between the permanent support and the transferable image layer is the adhesive power between the permanent support and the peelable layer.

When the peelable layer is removed by etching at development, these adhesive powers are defined as follows.

$P_2$: The adhesive power between the image-receiving layer and the imaged light-sensitive resin layer after development.

$P_3$: The adhesive power between the peelable layer imagewise remained and the temporary support.

$P_4$: The adhesive power between the permanent support and the peelable layer imagewise remained.

When the image-forming sheet (light-sensitive material) does not have a peelable layer, the peelable layer imagewise remained in the aforesaid definition for the adhesive powers may be replaced by the light-sensitive resin layer imagewise remained.

Furthermore, when images are formed by superposing four image layers each having each color for making a color proof, a full color display sheet, etc., the image-forming sheet (light-sensitive material) upon transferring the image layer after two colors superposing is brought into contact with not only the image-receiving layer but also the peelable layer, the imagewise remaining peelable layer, or the imagewise light-sensitive resin layer. In this case, the adhesive powers between the image layer and the peelable layer, between the image layers, and between the peelable layers may be controlled to become higher than $P_2$ so that peeling does not occur between these layers during the steps of transfer and re-transfer.

In the case of not forming a peelable layer, an adhesive layer as described in Japanese Patent Publication Nos. 15326/71 (corresponding to U.S. Pat. No. 3,721,557) and 441/74 may be, as a matter of course, formed on the surface of a permanent support for increasing the adhesive power $P_4$ between the permanent support and the transferable image layer.

According to the process of this invention, since an image layer formed on a temporary support of a transferable light-sensitive material is transferred onto an image-receiving sheet and then the image layer is transferred onto a permanent support to form images thereon, the images formed are correct in form. Also, the image-receiving sheet is composed of a support and a single image-receiving layer formed thereon. Hence, the image-receiving sheet can be produced simply and at low cost as compared to the case of employing plural layers for the image-receiving layer, which results in reducing the burden of the cost of the image-forming process. Furthermore, since the adhesive power $P_1$ between the support for the image-receiving sheet and the image-receiving layer and the adhesive power $P_2$ between the image-receiving layer and the image layer, upon peeling the transferable image layer from the image-receiving sheet are higher than the adhesive power $P_3$ between the transferable image layer and the temporary support, and since the adhesive power $P_4$ between the permanent support and the transferable image layer and adhesive power $P_1$ are higher than the adhesive power $P_2$, the image-receiving layer of over 10 μm in thickness of the image-receiving sheet is not transferred onto the permanent support upon transferring the transferable image layer onto the permanent support. Thus, abnormal heaping up of images or unnecessary luster does not occur. Accordingly, in this invention excellent color images can be obtained without reducing the similarity to prints and without the need of matting treatment. That is, the image-forming process of this invention is suitable for making color sheets, for a color proof, color display, etc.

The following examples serve to illustrate more practically this invention without limiting, however, the scope of this invention.

EXAMPLE 1

A coating liquid having the following composition was coated on a polyethylene terephthalate film support of 100 μm in thickness and dried to form a peelable layer at a dry thickness of 0.5 μm.

| | |
|---|---|
| Alcohol-soluble polyamide (CM-8000, η: 20° C., viscosity of methanol solution of 10 wt % of the polyamide 23 cps, trade name, made by Toray Industries, Inc.) | 7.2 g |
| Polyhydroxystyrene (Resin M, mean molecular weight: 5,500, trade name, made by Maruzen Oil Co., Ltd.) | 1.8 g |
| Methanol | 400 g |
| Methyl Cellosolve | 100 g |

Four sheets of such coated films were prepared.

Then, each of 4 kinds (Y, M, C and B) of coating liquids shown in Table 1 below was coated on each peelable layer thus formed and dried to form on each a light-sensitive resin layer of 2.4 μm in thickness colored in yellow (Y), magenta (M), cyan (C), or black (B).

TABLE 1

| | Y (g) | M (g) | C (g) | B (g) |
|---|---|---|---|---|
| Benzyl methacrylate/methacrylic acid copolymer (73/27 in mole ratio, viscosity η: 0.12) | 60 | 60 | 60 | 60 |
| Pentaerythritol tetraacrylate | 43.2 | 43.2 | 43.2 | 43.2 |
| Michler's ketone | 2.4 | 2.4 | 2.4 | 2.4 |
| 2-(o-Chlorophenyl)4,5-diphenyl imidazole dimer | 2.5 | 2.5 | 2.5 | 2.5 |
| Seika Fast Yellow H-0755 (trade name, made by Dainichiseika Color & Chemicals Mfg. Co., Ltd.) | 9.4 | — | — | — |
| Seika Fast Carmin 1483 (trade name, made by Dainichiseika Color & Materials Mfg. Co., Ltd.) | — | 5.2 | — | — |
| Cyanine Blue 4820 (trade name, made by Dainichiseika Color & Chemicals Mfg. Co., Ltd.) | — | — | 5.6 | — |
| Mitsubishi Carbon Black KA-100 (trade name, made by Mitsubishi Chemical Industries Ltd.) | — | — | — | 6.6 |
| Methylcellosolve acetate | 560 | 560 | 560 | 560 |
| Methyl ethyl ketone | 280 | 280 | 280 | 280 |

(Note): The viscosity η means the intrinsic viscosity in a methyl ethyl ketone solution thereof at 25° C.

Furthermore, a coating liquid having the following composition was coated on each light-sensitive resin layer thus formed and dried to form on each a protective layer of 1.5 μm in dry thickness. Thus, 4 kinds of transferable light-sensitive sheets (for nega/posi) of yellow (Y), magenta (M), cyan (C), and black (B) were prepared, respectively.

| | |
|---|---|
| Polyvinyl alcohol (GL-05, trade name, made by Nippon Synthetic Chemical Industry Co., Ltd.) | 60 g |
| Water | 970 g |
| Methanol | 30 g |

Each corresponding negative mask was superposed on each of the aforesaid 4 kinds of transferable light-sensitive sheets while matching the position by means of register pins and the light-sensitive sheet was exposed to a super high pressure mercury lamp of 2 kW at a distance of 50 cm. Thereafter, each transferable light-sensitive sheet thus exposed was subjected to development processing by a color art processor CA-600P (trade name, made by Fuji Photo Film Co., Ltd.) using a color art developer CA-L (trade name, made by Fuji Photo Film Co., Ltd.) diluted to 5 times for 22 seconds at 32° C. to remove the protective layer and the light-sensitive resin layer at the unexposed portions. As a result, positive images on the peelable layer of each transferable sheet were formed.

In this manner, 4 kinds of color proofing sheet each having each color were obtained.

Also, a coating liquid having the following composition was coated on a polyethylene terephthalate film support of 100 μm in thickness and dried to form an image-receiving layer of 20 μm in dry thickness. Thus, an image-receiving sheet was prepared.

| | |
|---|---|
| Ethylene-ethyl acrylate copolymer resin (ethylene unit 81% by weight, ethyl acrylate unit 19% by weight, EVAFLEX-EEA #A-720, trade name, made by Mitsui Du Pont Polychemical Co.) | 15 g |
| Fluorine series surface active agent (Megafac F-177, trade name, made by Dainippon Ink and Chemicals, Inc.) | 0.4 g |
| Toluene | 100 ml |

When the image-receiving sheet thus obtained was superposed on the aforesaid color proofing sheet having black images so that the image-receiving layer was brought into contact with the imaged surface of the latter while matching the position by register pins and the black images were transferred onto the image-receiving sheet by means of a color art transfer machine CA-600T (trade name, made be Fuji Photo Film Co., Ltd.), the black images were completely transferred from the color proofing sheet together with the peelable layer onto the image-receiving sheet.

Then, when the same transfer procedure as above was repeatedly applied to the image-receiving sheet having the black images thus transferred thereto together with the peelable layer using the color proofing sheets having formed thereon yellow images, magenta images and cyan images, respectively, each color image was completely transferred from each color proofing sheet onto the image-receiving sheet to provide color images having the same colors as the original, said images being contrary in the right and left to the original.

Furthermore, when the image-receiving sheet having 4 transferred images each having each color was superposed on white art paper so that the imaged surface was in contact with the surface of the art paper and the transferring procedure as above was applied, the color images very similar to the original in the form and colors were completely transferred onto the art paper. The color images did not have excessive luster and hence the application of a matting treatment was unnecessary. In addition, it was confirmed that the image-receiving layer completely remained on the image-receiving sheet after transferring the color images.

Also, from the aforesaid fact, it is clear that the adhesive power $P_1$ between the support for the image-receiving sheet and the image-receiving layer and the adhesive power $P_2$ between the transferable image layer and the image-receiving layer upon peeling the transferable image layer from the image-receiving sheet are higher than the adhesive power $P_3$ between the transferable image layer and the temporary support, and also the adhesive power $P_4$ between the permanent support and the transferable image layer and adhesive power $P_1$ upon transferring the image layer onto the permanent support and peeling the image-receiving sheet from the permanent support are higher than adhesive power $P_2$.

EXAMPLE 2

Each of 4 kinds of the transferable light-sensitive sheets each having each color prepared by the same manner as in Example 1 was light-exposed by the same manner as in Example 1 and developed using a developer having the following composition to simultaneously remove the peelable layer at the non-image portions. That is, the dot image portion formed on each transferable light-sensitive sheet was composed of the peelable layer and the photopolymerizable layer cured by light exposure and the images were formed in the state that the surface of the polyethylene terephthalate was exposed at the non-image portions thereof.

| Developer Composition | |
|---|---|
| Sodium hydroxide | 0.3 g |
| Surface active agent (Pelex NBL, | 5 g |
| trade name, made by Kao Atlas Co.) | |
| Water | 100 ml |

Then, an image-receiving sheet was prepared by the same manner as in Example 1 and each image layer was transferred onto the image-receiving layer of the image-receiving sheet by the same manner as in Example 1. When the color images formed on the image-receiving sheet were transferred onto white art paper and then the image-receiving sheet was peeled off, the image-receiving sheet was peeled at the interface between the image-receiving layer and the imaged portion and the color images transferred on the white art paper had good resemblance to prints and did not need any surface matting treatment as in the case of Example 1.

EXAMPLE 3

A coating composition having the following composition was coated as in the case of Example 1 to prepare an image-receiving sheet.

| Coating Composition | |
|---|---|
| Ethylene-vinyl acetate copolymer (ethylene 72%, vinyl acetate 28% by weight ratio, EVAFLEX #250, trade name by Mitsui Du Pont Polychemical Co.) | 15 g |
| Fluorine series surface active agent (Florad FC-430, trade name, made by 3M Co.) | 0.5 g |
| Chlorinated polyethylene (Superchlon 907HA, trade name, made by Sanyo-Kokusaku Pulp Co., Ltd.) | 0.05 g |
| Toluene | 100 ml |

Then, each of the image layers having each color formed as in Example 1 was transferred onto the image-receiving sheet. When the color images formed on the image-receiving sheet were transferred onto white art paper and the image-receiving sheet was peeled off as in Example 1, the image-receiving sheet was peeled at the interface between the image-receiving layer and the imaged portion. The color images transferred on the white art paper had good resemblance to prints without need of surface matting treatment as in the case of Example 1.

Example 4

By following the same procedure as in Example 2, except that the coating liquid for each light-sensitive material of each color was as shown in Table 2 below and coated at a dry thickness of 2.4 μm, 4 kinds (yellow (Y), magenta (M), cyan (C), and black (B)) of posi-posi type transferable light-sensitive materials were prepared. In this procedure, the image-receiving sheet was prepared by the same manner as in Example 1.

TABLE 2

| | Y (g) | M (g) | C (g) | B (g) |
|---|---|---|---|---|
| Adduct of acetone-pyrogallol condensate (mean polymerization degree 3) and 2-diazo-1-naphthol-4-sulfenyl chloride | 1.02 | 0.61 | 0.87 | 1.26 |
| Novolak type phenol-formaldehyde resin (PR-50716, trade name, made by Sumitomo Dures Co.) | 2.87 | 1.72 | 2.44 | 3.52 |
| Abietic acid | 1.23 | 1.73 | 1.05 | 1.52 |
| Catilon Brilliant Yellow 5GL | 1.064 | 0.096 | — | 1.2 |

TABLE 2-continued

|  | Y (g) | M (g) | C (g) | B (g) |
|---|---|---|---|---|
| Rhodamine 6GCP | — | — | — | 0.54 |
| Rhodamine B | — | 0.102 | — | — |
| Safranine OK70:100 | — | 0.384 | 0.012 | — |
| Victoria Pure Blue | — | — | 0.57 | 0.40 |
| Erio Glaucine X | — | — | 0.618 | — |
| Tricresyl phosphate | 0.51 | 0.31 | 0.44 | 0.64 |
| Fluorine series surface active agent (FC-430, trade name, made by 3M Co.) | 0.04 | 0.04 | 0.04 | 0.04 |
| Methyl ethyl ketone | 19.0 | 19.5 | 17.0 | 18.0 |
| Methylcellosolve acetate | 44 | 43.5 | 42.5 | 43.5 |
| Methylcellosolve | 44 | 43.5 | 42.5 | 43.5 |

Then, each transferable light-sensitive material was light-exposed and developed as in Example 2 to form each transferable image layer of each color and each image layer was repeatedly transferred onto an image-receiving sheet prepared as in Example 2 by the same procedure as in Example 2 to form color image on the image-receiving sheet. When the color images on the image-receiving sheet were transferred onto white art paper as in Example 2 and the image-receiving sheet was peeled from the white art paper, the image-receiving sheet was peeled at the interface between the image-receiving layer thereof and the image portion. The images transferred on the white art paper were good as in the case of Example 2.

EXAMPLE 5

A color proofing sheet having formed thereon black images was prepared by the same manner as Example 1 and when the black images were transferred onto an image-receiving sheet prepared as in Example 1 and further the black images transferred on the image-receiving sheet was transferred onto white art paper by the same manner as Example 1, the image-receiving layer of the image-receiving sheet completely remained on the image-receiving sheet and the black images were completely transferred on the art paper.

EXAMPLE 6 AND COMPARATIVE EXAMPLES 7, 8, AND 9

By following the same procedure as in Example 1, except that a coating liquid having the following composition was used as a coating liquid for image-receiving sheet, each image-receiving sheet was prepared.

|  | Example 6 | Comparative Example 7 | Comparative Example 8 | Comparative Example 9 |
|---|---|---|---|---|
| Ethylene-vinyl acetate copolymer (ethylene 67%, vinyl acetate 33% by weight ratio, EVAFLEX #150, trade name, made by Mitsui Du Pont Polychemical Co.) | 15 g | 15 g | 15 g | 15 g |
| Fluorine-series surface active agent (Megafac F-177, trade name, made by Dainippon Ink and Chemicals, Inc.) | 0.32 g | 0.21 g | 0.10 g | — |
| Chlorinated polyethylene (Superchlon 907 HA, trade name, made by Sanyo-Kokusaku Pulp Co., Ltd.) | 0.005 g | 0.005 g | 0.005 g | 0.005 g |
| Toluene | 100 ml | 100 ml | 100 ml | 100 ml |

Then, each of 4 kinds of images layers each having each color prepared by the same manner as in Example 2 was successively transferred onto the image-receiving sheet by the same as in Example 1. Then, the color images thus formed were transferred onto white art paper. Thereafter, the extent of picking of the art paper was visually observed. The results obtained are shown in Table 3 below.

TABLE 3

| Image-Receiving Sheet | Surface Active Agent (wt %) | Picking |
|---|---|---|
| Example 6 | 2.1 | No picking |
| Comparative Example 7 | 1.4 | A little picking |
| Comparative Example 8 | 0.7 | Considerably picking |
| Comparative Example 9 | — | Extensive picking |

From the results shown in Table 3 above, it can be seen that the amount of the fluorine series surface active agent in the image-receiving layer has a large influence on the occurrence of picking and when the surface active agent is added to the image-receiving layer in an amount of at least 2% by weight, good transfer of images is achieved.

While the invention has been described in detail and with reference to specific embodiments thereof, it will be apparent to one skilled in the art that various changes and modifications can be made therein without departing from the spirit and scope thereof.

What is claimed is:

1. An image-forming process comprising the steps of:
   (A) transferring an image layer, formed on a transferable light-sensitive material, onto an image-receiving sheet, and
   (B) transferring the image layer onto a permanent support,
      wherein the image-receiving layer of the image-receiving sheet contains a fluorine-series surface active agent in an amount of from 2 to 40% by weight based on the entire weight of the image-receiving layer, wherein said surface active agent comprises a copolymer of (i) from 10 to 70% by weight of a fluoroaliphatic group-containing acrylate or methacrylate component, and (ii) from 90 to 30% by weight of a poly(oxyalkylene) acrylate or methacrylate component, and wherein said fluoroaliphatic group is a fluoraliphatic group having from 3 to 20 carbon atoms and contains at least 40% by weight of fluorine, wherein at least 3 carbon atoms of the terminal moiety are fluorinated and wherein the image-receiving sheet comprises a support having formed thereon an image-receiving layer composed of a composition containing an organic high molecular material as the main component, wherein adhesion $P_1$ between the support of the image-receiving sheet and the image-receiving layer and adhesion $P_2$ between the image-receiving layer and the image layer are higher than adhesion $P_3$ between the image layer and the support of the transferable light-sensitive material, and also adhesion $P_4$ between the permanent support and the image layer and adhesion $P_1$ are higher than adhesion $P_2$, and wherein the image layer is transferred onto the permanent support via the image-receiving sheet without transferring the image-receiving layer onto the permanent support.

2. The image-forming process as claimed in claim 1, wherein the organic high molecular material constituting the image-receiving layer of the image-receiving sheet is a copolymer of ethylene and at least one compound selected from the group consisting of vinyl acetate, acrylic acid, an alkyl acrylate, and an $\alpha,\beta$-unsaturated carboxylic acid.

3. The image-forming process as claimed in claim 1, wherein said organic high molecular material has a softening point, as determined by the Vicat method, of less than 80° C.

4. The image-forming process as claimed in claim 3, wherein said organic high molecular material has a softening point, as determined by the Vicat method, of less than 60° C.

5. The image-forming process as claimed in claim 4, wherein said organic high molecular material has a softening point, as determined by the Vicat method, of less than 50° C.

6. The image-forming process as claimed in claim 1, wherein the organic high molecular material is selected from the group consisting of a polyolefin, an ethylene copolymer, polyvinylchloride, a vinylchloride copolymer, polyvinylidene chloride, a vinylidene chloride copolymer, polystyrene, a styrene copolymer, a vinyltoluene copolymer, poly(meth)acrylic acid ester, a (meth)acrylic acid ester copolymer, a polyamide resin, a synthetic rubber and chlorinated rubber.

7. The image-forming process as claimed in claim 1, wherein the image-receiving layer of the image-receiving sheet contains said fluorine-series surface active agent in an amount of from 2 to 10% by weight based on the entire weight of the image-receiving layer.

8. The image-forming process as claimed in claim 1, wherein said image-receiving layer has a thickness of 1 to 50 $\mu$m.

9. The image-forming process as claimed in claim 8, wherein said image-receiving layer has a thickness of 5 to 30 $\mu$m.

* * * * *